US006769920B1

(12) United States Patent
Mease et al.

(10) Patent No.: US 6,769,920 B1
(45) Date of Patent: Aug. 3, 2004

(54) METHOD AND APPARATUS FOR FLEXIBLE INTERCONNECTION OF COMPUTER SYSTEM COMPONENTS

(75) Inventors: Keith D. Mease, Gibbstown, NJ (US); Sean M. McClain, Havertown, PA (US); Frank J Campisi, Mullica Hill, NJ (US); Norman K Newman, Hatfield, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/390,367

(22) Filed: Mar. 17, 2003

(51) Int. Cl.[7] ............................................... H01R 12/00
(52) U.S. Cl. ........................................ 439/67; 439/493
(58) Field of Search ............................ 439/67, 77, 492, 439/493, 499; 361/683

(56) References Cited

U.S. PATENT DOCUMENTS 5,077,683 A * 12/1991 Aydin ......................... 361/686
5,251,095 A * 10/1993 Miller et al. ................. 361/694
5,978,821 A * 11/1999 Freeny ........................ 361/683
6,017,222 A * 1/2000 Kao ............................. 439/67
6,517,361 B1 * 2/2003 Yatskov et al. ............... 439/67

* cited by examiner

Primary Examiner—Tho D. Ta
(74) Attorney, Agent, or Firm—Lise A. Rode; Mark T. Starr; RatnerPrestia

(57) ABSTRACT

A connection assembly for providing interconnection between a computer processor assembly and a module is provided. The connection assembly includes a flex circuit having signal paths for communication between the computer processor assembly and the module. The connection assembly also includes a connector coupled to an end portion of the flex circuit and configured to connect to the computer processor assembly. The connection assembly also includes another connector coupled to an opposite end portion of the flex circuit and is configured to connect to the module. The flex circuit is configured to facilitate movement of the module with respect to the computer processor assembly, the flex circuit having a retracted position with the module proximate to the computer processor assembly and an extended position with the module spaced from the computer processor assembly.

19 Claims, 10 Drawing Sheets

METHOD AND APPARATUS FOR FLEXIBLE INTERCONNECTION OF COMPUTER SYSTEM COMPONENTS

FIELD OF THE INVENTION

This invention relates to the interconnection of computer system components, and more particularly, to the flexible interconnection of a computer processor assembly and an I/O module.

BACKGROUND OF THE INVENTION

When multiple components of a computer system are mounted in a rack it may be desirable to access one or more of the components in the rack (e.g., for maintenance, troubleshooting, upgrades, etc.). As such, in order to access such a component, it may be desirable to provide for movement between the component to be accessed and the remainder of the computer system.

One problem with providing relative motion between components is that long bundles of cable are typically used to connect the system components. As such, a large amount of excess cable is stored in the rack to provide for this relative motion. This excess cable occupies substantial volume in the rack, and creates unnecessary impedance in the signal transmission paths between the moveable system component and the remainder of the system.

Another problem with providing access to one or more components of a computer system is that the entire computer system (or at least a substantial portion of the system) is typically shut down to access the desired components. Such downtime can be inconvenient and expensive.

As such, it would be desirable to provide for relative motion between respective computer components while overcoming one or more of the above-recited deficiencies.

SUMMARY OF THE INVENTION

In an exemplary embodiment of the present invention, a connection assembly for providing interconnection between a computer processor assembly and a module is provided. The connection assembly includes a flex circuit having signal paths for communication between the computer processor assembly and the module. The connection assembly also includes a connector coupled to an end portion of the flex circuit and configured to connect to the computer processor assembly. The connection assembly also includes another connector coupled to an opposite end portion of the flex circuit and is configured to connect to the module. The flex circuit is configured to facilitate movement of the module with respect to the computer processor assembly, the flex circuit having a retracted position with the module proximate to the computer processor assembly and an extended position with the module spaced from the computer processor assembly.

In another exemplary embodiment of the present invention, a computer system is provided. The computer system includes a computer processor assembly and a module that is moveable between a retracted position proximate to the computer processor assembly and an extended position spaced from the computer processor assembly. The computer system also includes a flex circuit having signal paths for communication between the computer processor assembly and the module. The flex circuit includes a first connector coupled to a first end portion of the flex circuit and configured to connect to the computer processor assembly and a second connector coupled to a second end portion of the flex circuit and configured to connect to the module. The flex circuit is configured to facilitate movement of the module between the retracted position and the extended position.

In yet another exemplary embodiment of the present invention, a method of interconnecting a computer processor assembly and a module is provided. The method includes coupling a connector at an end portion of a flex circuit to the computer processor assembly. The method also includes coupling another connector at an opposite end portion of the flex circuit to the module. Through this method, movement of the module with respect to the computer processor assembly and movement of the flex circuit between a retracted position with the module proximate to the computer processor assembly and an extended position with the module spaced from the computer processor assembly is facilitated.

BRIEF DESCRIPTION OF THE DRAWINGS

Exemplary embodiments of the invention will be described with reference to the drawings, of which.

DETAILED DESCRIPTION OF THE INVENTION

Figure 1:
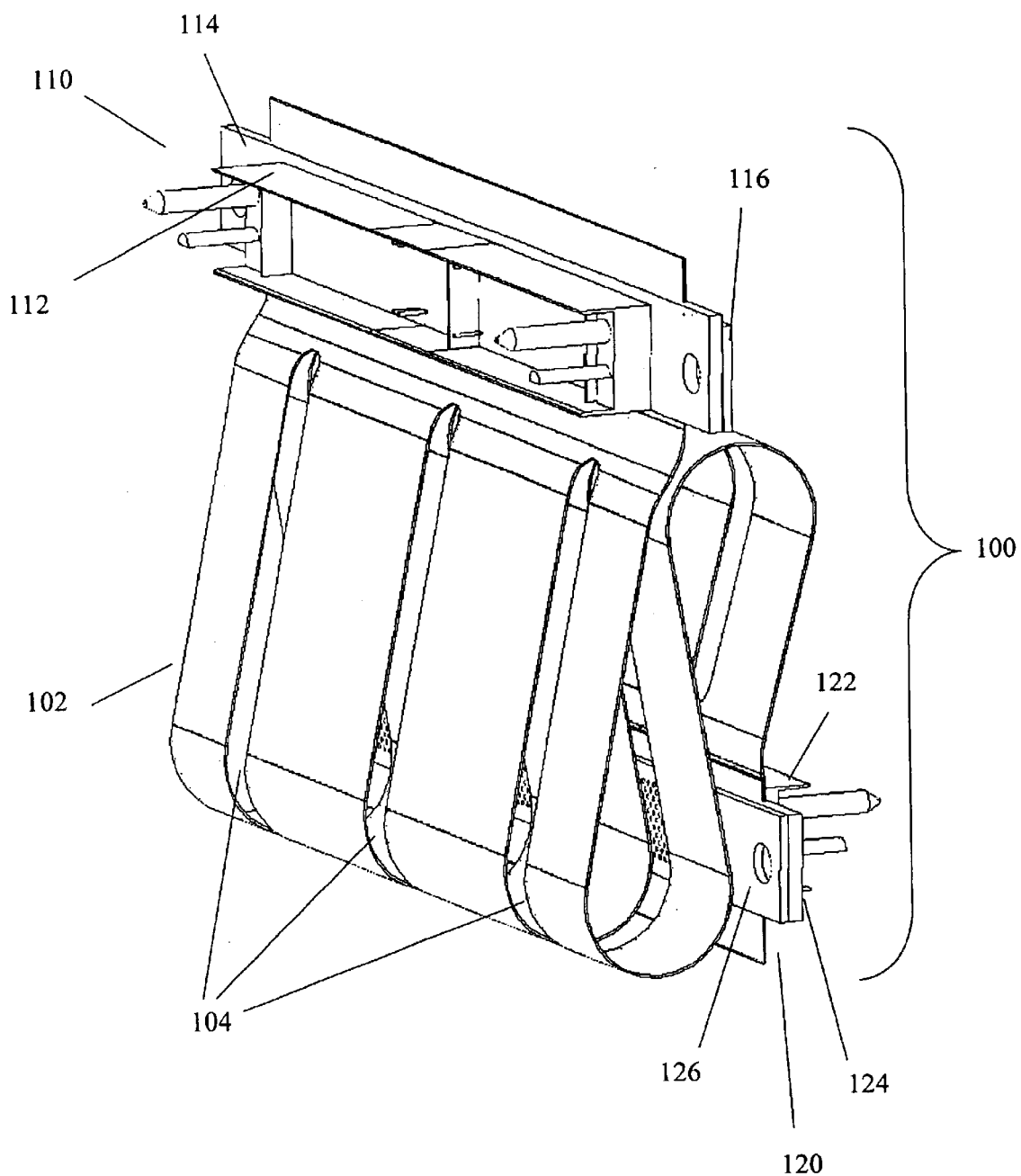
FIG. 1 is a perspective view of a connection assembly including a flex circuit in accordance with an exemplary embodiment of the present invention.

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Referring to the figures generally, a connection assembly 400 for providing interconnection between a computer processor assembly 432 and a module 436 is provided. The connection assembly 400 includes a flex circuit 402 having signal paths for communication between the computer processor assembly 432 and the module 436. The connection assembly 400 also includes a connector 410 coupled to an end portion of the flex circuit 402 and configured to connect to the computer processor assembly 432. The connection assembly 400 also includes another connector 420 coupled to an opposite end portion of the flex circuit 402 and is configured to connect to the module 436. The flex circuit 402 is configured to facilitate movement of the module 436 with respect to the computer processor assembly 432, the flex circuit having a retracted position with the module 436 proximate to the computer processor assembly 432 and an extended position with the module 436 spaced from the computer processor assembly 432.

In another exemplary embodiment of the present invention, a computer system 430 is provided. The computer system 430 includes a computer processor assembly 432 and a module 436 that is moveable between a retracted position proximate to the computer processor assembly, 432 and an extended position spaced from the computer processor assembly 432. The computer system 430 also includes a flex circuit 402 having signal paths for communication between the computer processor assembly 432 and the module 436. The flex circuit 402 includes a first connector 410 coupled to a first end portion of the flex circuit 402 and configured to connect to the computer processor assembly 432 and a second connector 420 coupled to a second end portion of the flex circuit 402 and configured to connect to the module 436. The flex circuit 402 is configured to facilitate movement of the module 436 between the retracted position and the extended position.

In yet another exemplary embodiment of the present invention, a method of interconnecting a computer processor assembly and a module is provided. The method includes a step 500 of coupling a connector at an end portion of a flex circuit to the computer processor assembly. The method also includes a step 502 of coupling another connector at an opposite end portion of the flex circuit to the module. Through this method, movement of the module with respect to the computer processor assembly and the movement of the flex circuit between a retracted position with the module proximate to the computer processor assembly and an extended position with the module spaced from the computer processor assembly is facilitated.

Flex circuits (also known as flexible circuits or flexible circuit boards) are similar to printed circuit boards except that the material from which they are constructed is flexible rather than substantially rigid. As such, a flex circuit is an arrangement of printed wiring with a flexible base material. A flex circuit may include one, two, or several layers. Various materials have been used for the base material of a flex circuit. For example, polyester (Mylar) and polyimide (Kapton™) can be used though other materials are also contemplated.

In accordance with an exemplary embodiment of the present invention, a flex circuit is used to provide interconnection between a host computer system and a module that is moveable with respect to the host computer system (e.g., an I/O module). For example, it may be desirable to have an I/O module that is moveable with respect to the host computer system, where the host computer system includes a computer processor assembly. By making the I/O module moveable with respect to the host computer system, components housed within the I/O module, such as I/O cards, may be accessed for replacement, repair, or upgrade. In order to provide a moveable and technically improved interconnection path between the I/O module and the computer processor assembly, a flex circuit is used. For example, it has been discovered that by using a flex circuit to provide interconnection between an I/O module and a computer processor assembly, a signal path having a high bus bandwidth and reliable signal integrity is provided.

FIG. 1 is a perspective view of a connection assembly 100 used to provide interconnection between at least two components in a computer system. Connection assembly 100 includes flex circuit 102. Flex circuit 102 defines air slots 104 such that air movement is permitted across flex circuit 102, thereby allowing for adequate cooling of computer components in the vicinity of flex circuit 102. Slots 104 also provide for improved flexibility of flex circuit 102 in a number of directions. Connection assembly 100 also includes connector 110 and connector 120.

For example, connector 110 may be used to connect flex circuit 102 to a computer processor assembly of a host computer system. In an exemplary embodiment of the present invention, connector 110 includes system connector 112, rigid printed circuit portion 114, and rigid backer 116. System connector 112 connects to the computer processor assembly. Rigid printed circuit portion 114 is coupled with an end portion of flex circuit 102. Further, rigid printed circuit portion 114 and the end portion of flex circuit 102 may be integrally formed, and as such, portion 114 and the end portion of flex circuit 102 may be formed from a single printed circuit mold. Rigid printed circuit portion 114 is coupled to system connector 112, for example, by press fitting. Rigid backer 116 is coupled to the opposite side of rigid printed circuit portion 114.

Connector 120 may be used to connect flex circuit 102 to a module that is moveable with respect to a host computer system (e.g., an I/O module). Connector 120 includes I/O module connector 122, rigid printed circuit portion 124, and rigid backer 126. Rigid printed circuit portion 124 may be integrally formed with an end portion of flex circuit 102, and connector 122 is coupled to rigid printed circuit portion 124 (e.g., by press fitting). Rigid backer 126 may be coupled to the side of rigid printed circuit portion 124 opposite connector 122.

Figure 2:
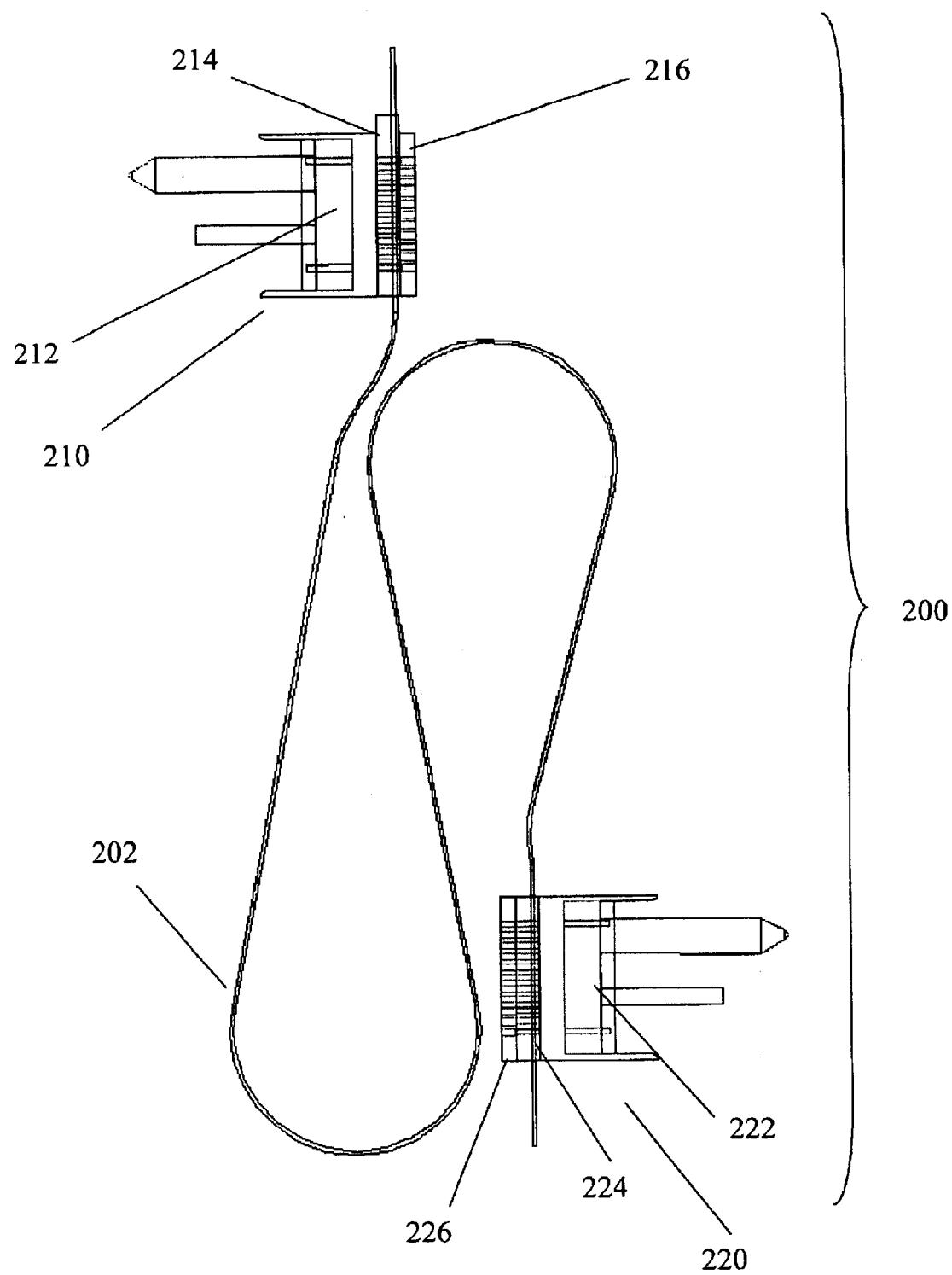
FIG. 2 is a side view of the connection assembly illustrated in FIG. 1.

FIG. 2 is a side view of a connection assembly 200. Connection assembly 200 includes flex circuit 202, connector 210, and connector 220. Connector 210 includes system connector 212, rigid printer circuit portion 214, and rigid backer 216. Connector 220 includes I/O module connector 222, rigid printer circuit portion 224, and rigid backer 226. FIG. 2 is an alternative embodiment that is different from the embodiment described by reference to FIG. 1 in that slots are not defined in flex circuit 202.

Figure 3:
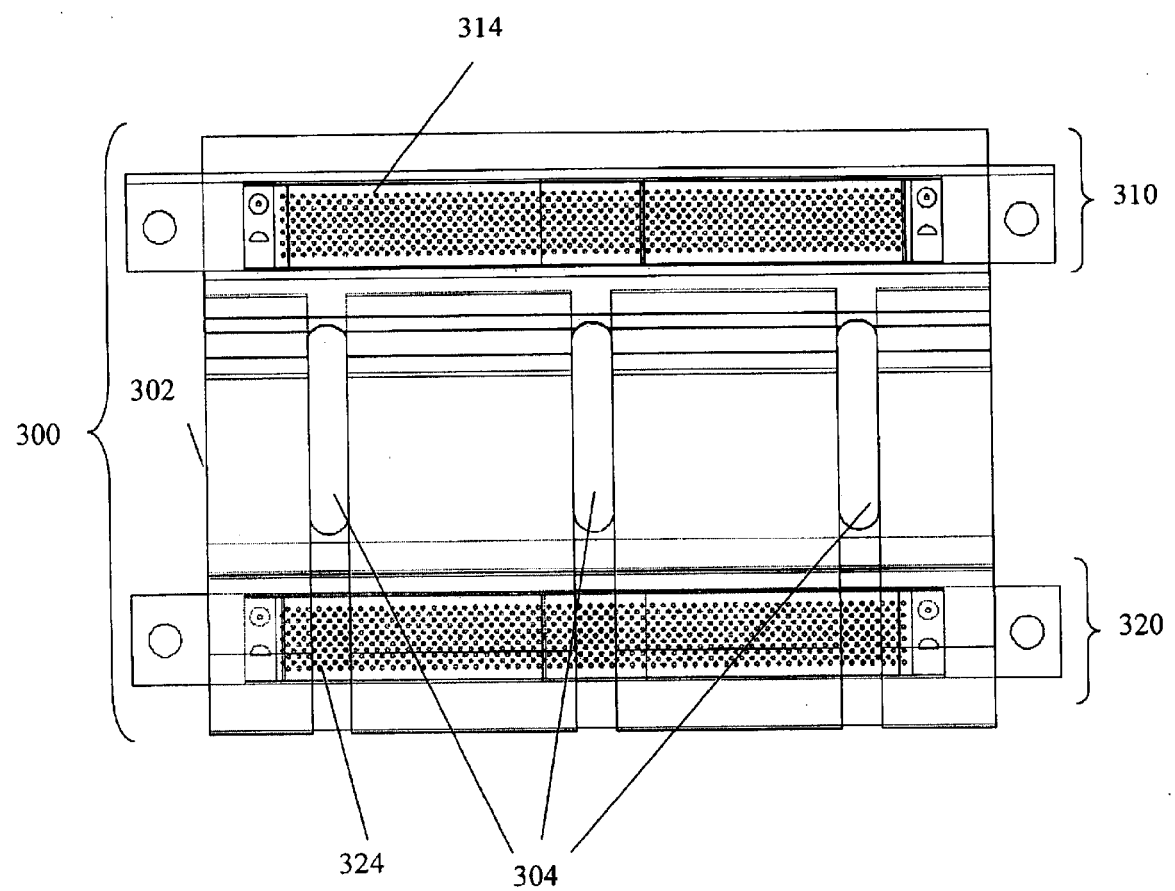
FIG. 3 is a front view of the connection assembly illustrated in FIG. 1.

FIG. 3 is a front view of connection assembly 300. Connection assembly 300 includes components similar to those discussed above with respect to FIGS. 1 and 2. Connection assembly 300 includes flex circuit 302, connector 310, and connector 320. Rigid printed circuit portions 314 and 324 are also shown coupled to respective end portions of flex circuit 302. Flex circuit 302 defines air slots 302 that permit air flow across flex circuit 302. Air slots 302 also provide improved flexibility of flex circuit 302 in several directions. Connectors 310 and 320 are used to connect to computer system components. For example, connector 310 may be used to connect flex circuit 302 to a computer processor assembly, and connector 320 may be used to connect flex circuit 302 to an I/O module that is moveable with respect to the computer processor assembly. FIG. 3 is an alternative embodiment that is different from the embodiments described by reference to FIGS. 1 and 2 in that both rigid printed circuit portions 314 and 324 are explicitly illustrated as being multi-pin circuit portions that are connected to a corresponding connector by press fitting.

In each of the connection assemblies illustrated in FIGS. 1–3, the flex circuit (i.e., 102 202, and 302) is shown in a retracted position. As such in the configuration where a computer processor assembly and an I/O module are included in a computer rack, and the I/O module is movable with respect to the computer processor assembly and the rack, flex circuit 102 (as well as 202 and 302) would be in the illustrated retracted position when the I/O module is in its retracted position substantially within the rack. When the I/O module is at least partially withdrawn from the rack, and thereby moved with respect to the computer processor assembly, the flex circuit is correspondingly moved from the retracted position into an at least partially extended position.

In the exemplary embodiments illustrated in FIGS. 1–3, flex circuit 102 (as well as 202 and 302) is substantially S-shaped when in the retracted position. This substantially S-shaped configuration provides for an efficient use of space within a computer chassis such as a computer rack.

Figure 4A:
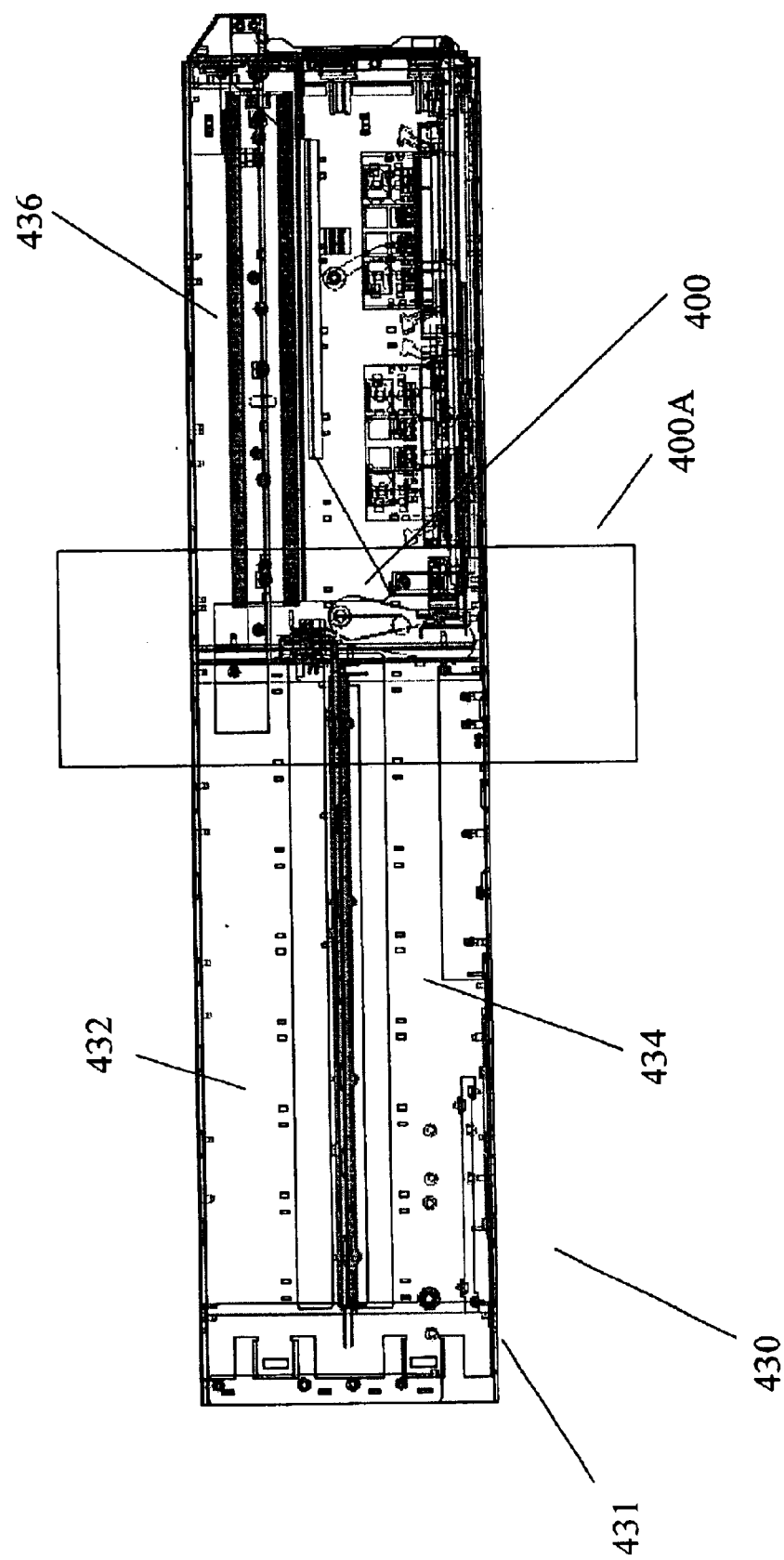
FIG. 4A is a side view of components of a computer system including a connection assembly having a flex circuit in accordance with an exemplary embodiment of the present invention.

FIG. 4A illustrates a computer system 430, for example, a cellular computer assembly for use in a rack type computer server system. System 430 includes chassis 431, processor portion 432 (not visible through chassis 431), and memory portion 434 (also not visible through chassis 431). Module 436 (e.g., an I/O module including I/O cards such as PCI cards) is moveable with respect to system 430, and in FIG. 4A, module 436 is shown in a retracted position (i.e., it is positioned proximate processor portion 432). Connection assembly 400 provides interconnection between module 436 and processor assembly 432. Detail 400A is illustrated in greater detail FIG. 4B.

Figure 4B:
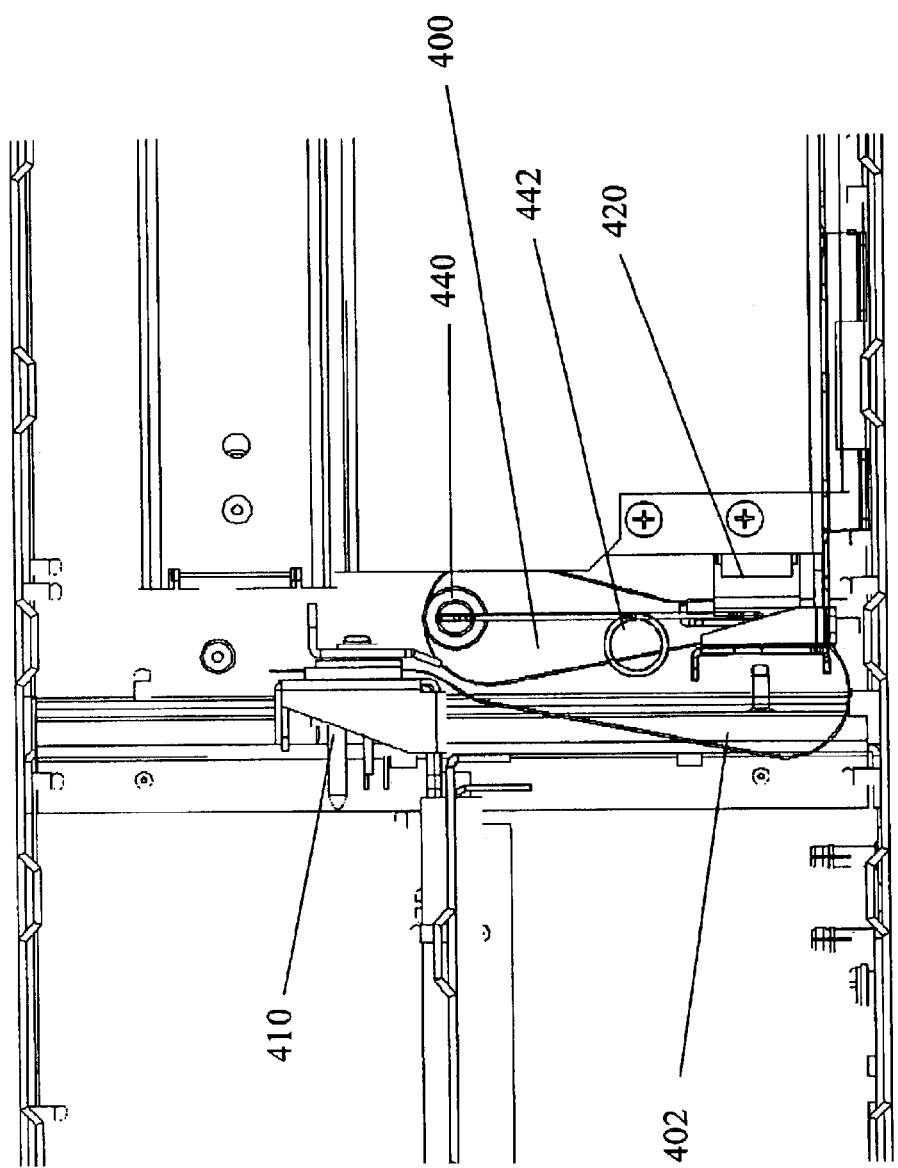
FIG. 4B is a detail of a portion of the components illustrated in FIG. 4A.

FIG. 4B illustrates connection assembly 400. Connection assembly 400 includes flex circuit 402, connector 410, and connector 420. Connector 410 is connected to processor portion 432 (not shown in FIG. 4B), while connector 420 is connected to module 436 (also not visible in FIG. 4B). Because module 436 is illustrated in a retracted position in FIG. 4A, flex circuit 402 is correspondingly illustrated in a retracted position in FIG. 4B. In the retracted position, flex circuit 402 is substantially S-shaped. This substantially S-shape is maintained when in the retracted position by use of guide bar 440 and spring 442 (e.g., a torsion spring). When moved between the retracted position and an extended position, flex circuit 402 moves across guide bar 440. Spring 442 is connected between module 436 and guide bar 440. As such, as flex circuit 402 moves across guide bar 440, spring 442 controls the shape of flex circuit 402. For example, when in the retracted position, spring 442 and guide bar 440 ensure that flex circuit 402 will be substantially S-shaped. Conversely, when in an extended position, spring 442 and guide bar 440 guide and control the shape of flex circuit 402 such that it extends from its compact S-shape to facilitate movement of module 436 while maintaining interconnection between processor portion 432 and module 436.

Figure 4C:
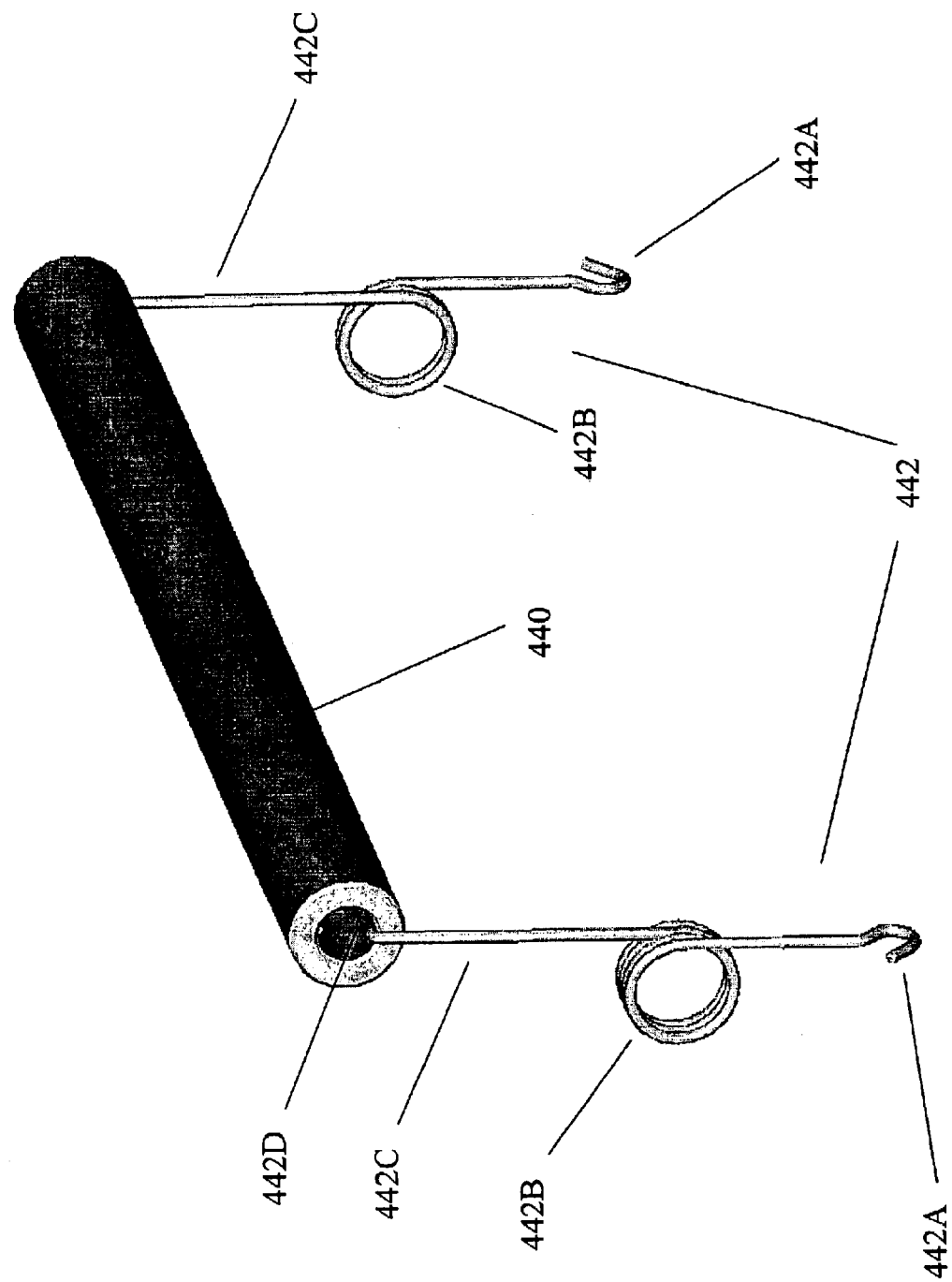
FIG. 4C is a perspective view of a guide assembly used in accordance with an exemplary embodiment of the present invention.

FIG. 4C is a detailed illustration of guide bar 440 and spring 442. Spring 442 includes two hooked portions 442A that connect to module 436. Each hooked portion 442A extends to a respective coiled portion 442B that in turn extends to a respective straight portion 442C. The two straight portions 442C are joined together at section 442D that is housed substantially within guide bar 440.

Module 436 is moveable with respect to system 430 in order to provide access to components housed within or adjacent module 436. As such, when it is desirable to access a component in module 436 (e.g., a component such as a PCI card in module 436), module 436 is moved or slid with respect to system 430 and processor portion 432. Because connection assembly 400 provides interconnection between module 436 and processor portion 432, module 436 may be brought into an extended position where it is spaced from system 430 (and processor portion 432), as illustrated in FIG. 4D.

Figure 4D:
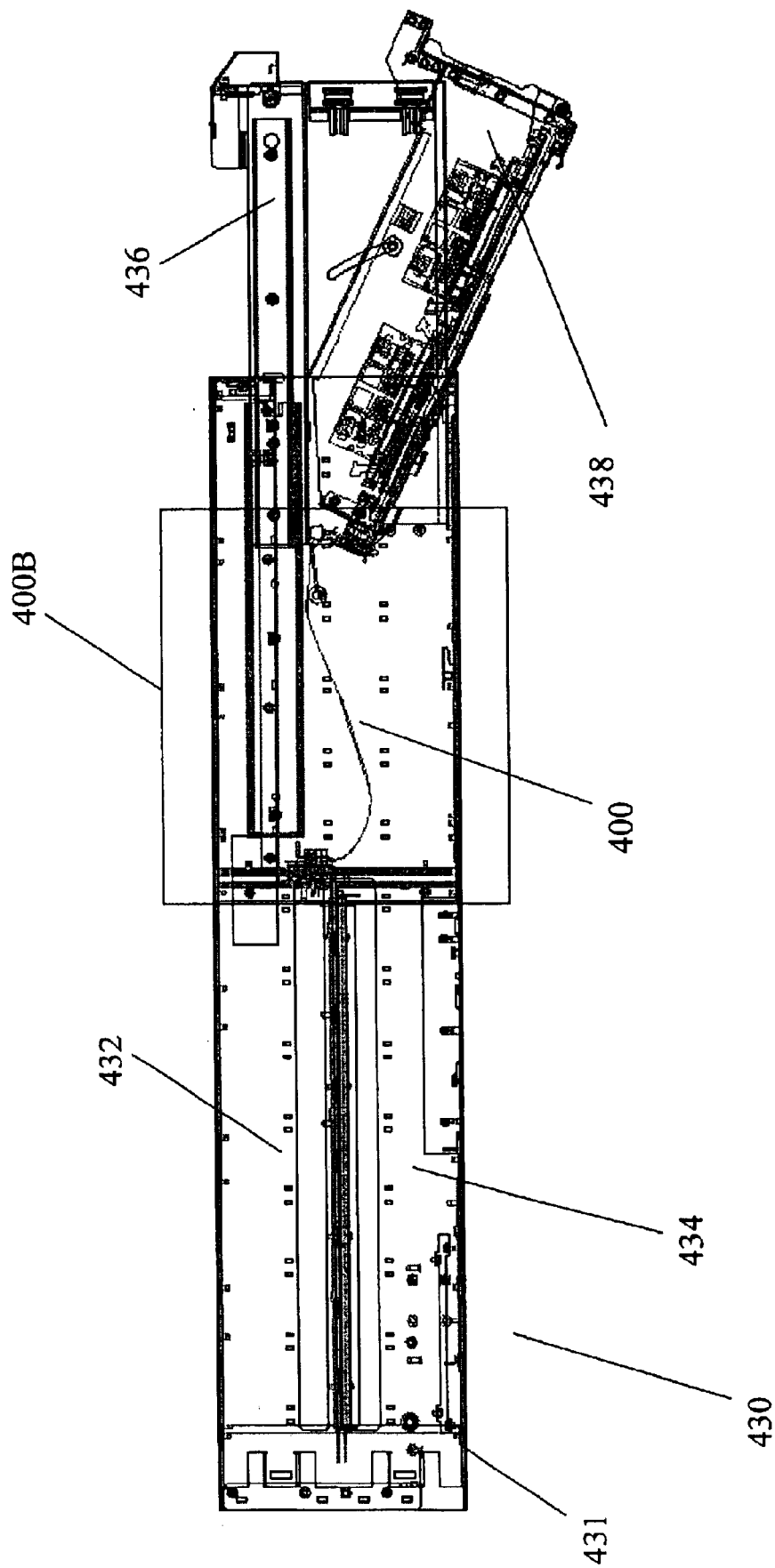
FIG. 4D is a side view of the components of the computer system illustrated in FIG. 4A, with the flex circuit in an extended position.

FIG. 4D illustrates system 430 including chassis 431, processor portion 432 (not visible in FIG. 4D), and memory portion 434 (also not visible in FIG. 4D). Module 436 is also illustrated in FIG. 4D. Module 436 is shown in an extended position with respect to system 430 (i.e., module 436 has been moved away from its retracted position proximate processor assembly 432 shown in FIG. 4A). In the exemplary embodiment illustrated in FIG. 4D, module 436 includes pivotal portion 438 that pivots with respect to the remaining portion of module 436. This pivoting action of pivotal portion 438 provides increased access to components housed within or adjacent module 436.

With module 436 in an extended position with respect to processor portion 432, flex circuit 402 is also in an extended position (i.e., flex circuit 402 is no longer substantially S-shaped in FIG. 4D). Detail 400B is illustrated in greater detail in FIG. 4E.

Figure 4E:
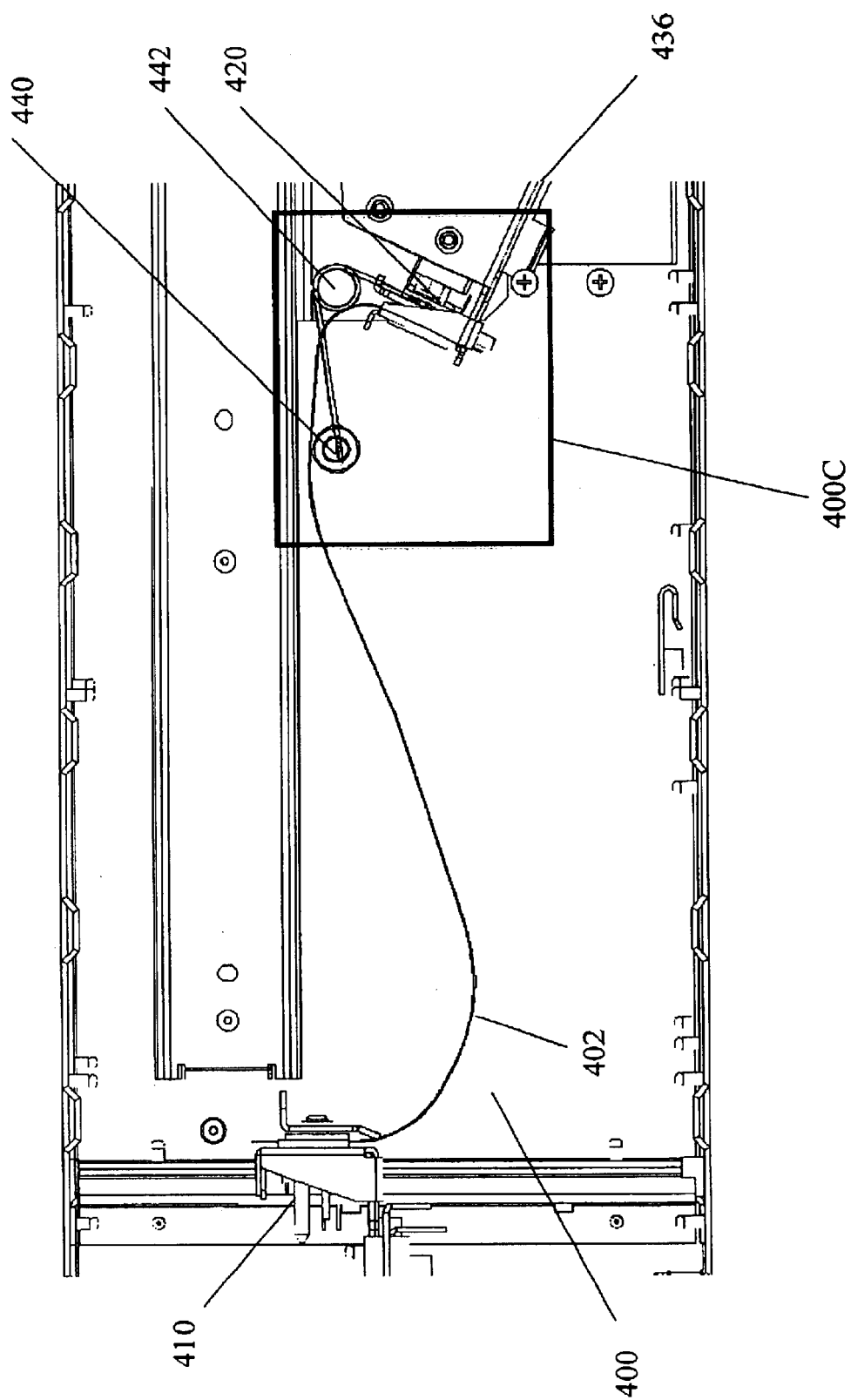
FIG. 4E is a detail of a portion of the components illustrated in FIG. 4D.

FIG. 4E illustrates connection assembly 400 in an extended position. Connection assembly 400 includes connector 410, that is connected to processor portion 432 (not visible in FIG. 4E). Connection assembly 400 also includes connector 420, that is connected to module 436 (a portion of which is illustrated in FIG. 4E). Flex circuit 402 extends between connector 410 and connector 420, thereby providing interconnection between processor assembly 432 and module 436.

As shown in FIG. 4E, flex circuit 402 is an extended position because module 436 has brought into an extended position where it is spaced from processor portion 432. Guide bar 440 and spring 442 work in tandem to guide and control the shape of flex circuit 402. Flex circuit 402 contacts guide bar 440 as shown in FIG. 4E. Guide bar 440 is coupled to spring 442, which is strained when module 436 is withdrawn to its extended position. Detail 400C is illustrated in greater detail in FIG. 4F.

Figure 4F:
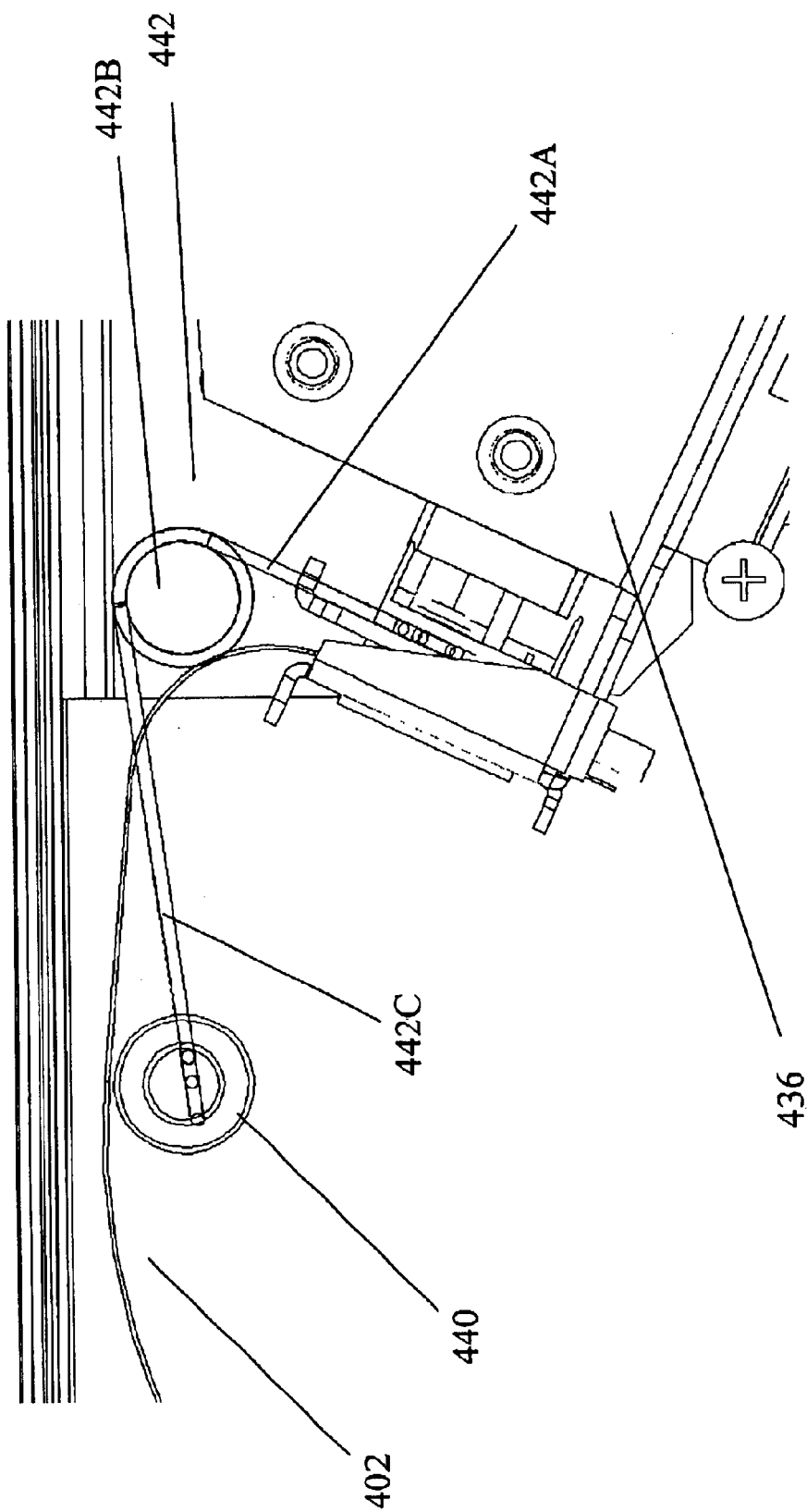
FIG. 4F is a further detail of a portion of the components illustrated in FIG. 4E.

Referring now to FIG. 4F, flex circuit 402 is shown in contact with guide bar 440. Straight portion 442C of spring 442 extends between guide bar 440 and coiled portion 442B (spring portion 442D is positioned substantially within guide bar 440, and as such, is not clearly visible in FIG. 4F). Hooked portion 442A (the hook of which is not visible in FIG. 4F) is connected to coiled portion 442B. The hook of hooked portion 442A is fastened to module 436 (not shown in FIG. 4F).

Figure 5:
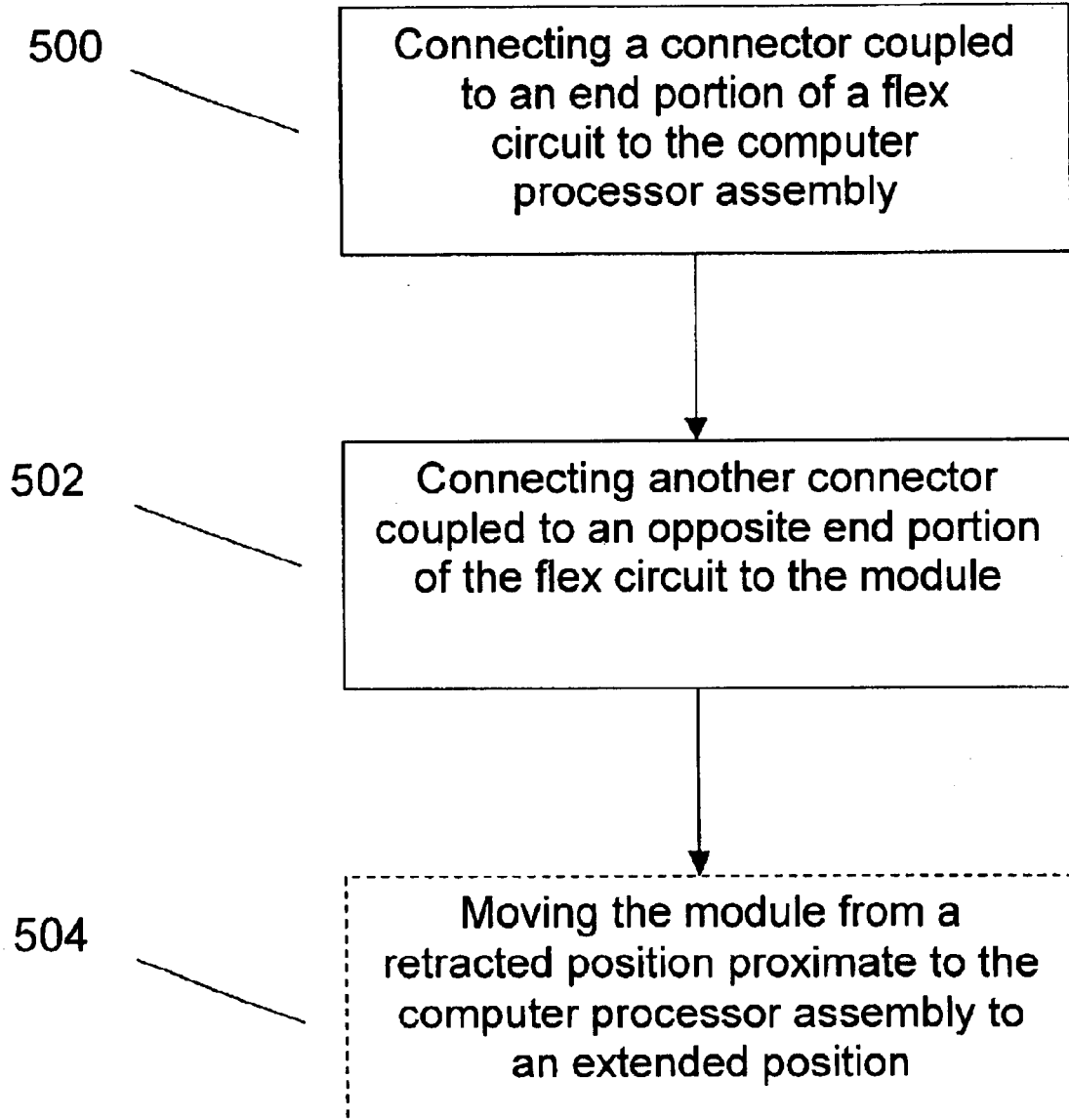
FIG. 5 is a flow diagram illustrating a method of interconnecting a computer processor assembly and a module in accordance with an exemplary embodiment of the present invention.

FIG. 5 is flow diagram illustrating a method of interconnecting a computer processor assembly and a module that is movable with respect to the computer processor assembly. For example, the module is an I/O module. At step 500, a connector that is coupled to an end portion of a flex circuit is connected to the computer processor assembly. At step 502 another connector that is coupled to the opposite end portion of the flex circuit is connected to the module. As such, interconnection is provided between the computer processor assembly and the module. At optional step 504, the module is moved from a retracted position where the module is proximate to the computer processor assembly to an extended position where the module is spaced from the computer processor assembly.

Through the various exemplary embodiments described herein, an apparatus and method for providing interconnection between computer components is provided. By using a flex circuit to provide this interconnection, a short bus path with substantially uniform impedance is provided. By using a guide bar and spring to control the shape of the flex circuit in the retracted and extended positions, efficient use of space within a computer chassis or rack is provided.

Through the various exemplary embodiments disclosed herein, a computer system is provided where a module (e.g., an I/O module) may be moved with respect to the host computer system, while minimizing bus lengths between the module and the host computer system.

Although the module that is movable with respect to the host computer system has primarily been described as an I/O module, the module is not limited thereto. Any module that is movable with respect to a host computer system or a computer processor assembly, and whose movement is facilitated by a flex circuit, may be used as the module.

Although the flex circuit has been illustrated herein as defining three air slots, any number of air slots may be defined by the flex circuit. For example, based on the location of computer components that are to be cooled by airflow, any number of air slots in any of a number of configurations may be utilized.

Although the biasing and shaping system of the flex circuit has been illustrated as a guide bar and spring, the biasing system is not limited to these components. As such, any system that guides and controls the shape of the flex circuit in both the retracted and extended positions may be used.

Although the flex circuit has been illustrated as being substantially S-shaped in its retracted position, the shape of the flex circuit in the retracted position is not limited thereto. Based on the configuration of other computer components housed within a computer rack, the retracted shape of the flex circuit may take on any of a number of shapes that make efficient use of space within the computer rack.

It will be appreciated that other modifications can be made to the illustrated embodiments without departing from the scope of this invention, which is separately defined in the appended claims.

What is claimed:

1. A connection assembly for providing interconnection between a computer processor assembly and a module, said connection assembly comprising:
   a flex circuit having signal paths for communication between the computer processor assembly and the module;
   a connector coupled to an end portion of said flex circuit and configured to connect to the computer processor assembly;
   another connector coupled to an opposite end portion of said flex circuit and configured to connect to the module, said flex circuit being configured to facilitate movement of the module with respect to the computer processor assembly, said flex circuit having a retracted position with the module proximate to the computer processor assembly and an extended position with the module spaced from the computer processor assembly; and
   a guide for biasing said flex circuit in a retracted shape when the flex circuit is in the retracted position.

2. The connection assembly of claim 1 wherein said retracted shape is substantially S-shaped.

3. The connection assembly of claim 1 wherein said guide comprises a spring positioned to bias said flex circuit in said retracted shape when the flex circuit is in the retracted position.

4. The connection assembly of claim 1 wherein said guide comprises a bar positioned for contact with said flex circuit and to urge said flex circuit into said retracted shape when the flex circuit is in said retracted position.

5. The connection assembly of claim 1 further comprising a rigid printed circuit portion located on at least one said end portion of said flex circuit to facilitate coupling of said connector or said another connector.

6. The connection assembly of claim 1 wherein said connector is coupled to said flex circuit via said rigid printed circuit portion.

7. The connection assembly of claim 1 wherein said another connector is coupled to said flex circuit via said rigid printed circuit portion.

8. A connection assembly for providing interconnection between a computer processor assembly and a module, said connection assembly comprising:
   a flex circuit having signal paths for communication between the computer processor assembly and the module;
   a connector coupled to an end portion of said flex circuit and configured to connect to the computer processor assembly; and
   another connector coupled to an opposite end portion of said flex circuit and configured to connect to the module, said flex circuit being configured to facilitate movement of the module with respect to the computer processor assembly, said flex circuit having a retracted position with the module proximate to the computer processor assembly and an extended position with the module spaced from the computer processor assembly,
   wherein a portion of said flex circuit defines a plurality of slots therein such that air flow can be moved through said flex circuit for cooling of said module or said computer processor assembly.

9. A computer system comprising:
   a computer processor assembly;
   a module that is moveable between a retracted position proximate to said computer processor assembly and an extended position spaced from said computer processor assembly;
   a flex circuit having signal paths for communication between said computer processor system and said module, said flex circuit including a first connector coupled to a first end portion of the flex circuit and configured to connect to the computer processor assembly and a second connector coupled to a second end portion of the flex circuit and configured to connect to the module, said flex circuit being configured to facilitate movement of the module with respect to the computer processor assembly between said retracted position and said extended position; and
   a guide for biasing said flex circuit in a retracted shape when the module is in the retracted position.

10. The computer system of claim 9 wherein said module comprises at least one I/O card.

11. The computer system of claim 9 wherein said retracted shape is substantially S-shaped.

12. The computer system of claim 9 wherein said guide comprises a spring positioned to bias said flex circuit in said retracted shape when the module is in the retracted position.

13. The computer system of claim 9 wherein said guide comprises a bar positioned for contact with said flex circuit and to urge said flex circuit into said retracted shape when the module is in said retracted position.

14. The computer system of claim 9 further comprising a rigid printed circuit portion located on said first end portion of said flex circuit to facilitate coupling of said first connector.

15. The computer system of claim 9 further comprising a rigid printed circuit portion located on said second end portion of said flex circuit to facilitate coupling of said second connector.

16. A computer system comprising:

a computer processor assembly;

a module that is moveable between a retracted position proximate to said computer processor assembly and an extended position spaced from said computer processor assembly; and a flex circuit having signal paths for communication between said computer processor system and said module, said flex circuit including a first connector coupled to a first end portion of the flex circuit and configured to connect to the computer processor assembly and a second connector coupled to a second end portion of the flex circuit and configured to connect to the module, said flex circuit being configured to facilitate movement of the module with respect to the computer processor assembly between said retracted position and said extended position, wherein a portion of said flex circuit defines a plurality of slots therein such that air flow can be moved through the flex circuit for cooling of said module or computer processor assembly.

17. A method of interconnecting a computer processor assembly and a module, said method comprising the steps of:

coupling a connector at an end portion of a flex circuit to the computer processor assembly;

coupling another connector at an opposite end portion of the flex circuit to the module, thereby facilitating movement of the module with respect to the computer processor assembly and the movement of the flex circuit between a retracted position with the module proximate to the computer processor assembly and an extended position with the module spaced from the computer processor assembly; and biasing the flex circuit to have a retracted shape when the module and the flex circuit are in the retracted position.

18. The method of claim 17 wherein said step of biasing includes biasing the flex circuit to have a substantially S-shape when the module and the flex circuit are in the retracted position.

19. A method of interconnecting a computer processor assembly and a module, said method comprising the steps of:

coupling a connector at an end portion of a flex circuit to the computer processor assembly;

coupling another connector at an opposite end portion of the flex circuit to the module, thereby facilitating movement of the module with respect to the computer processor assembly and the movement of the flex circuit between a retracted position with the module proximate to the computer processor assembly and an extended position with the module spaced from the computer processor assembly; and flowing cooling air through slots defined by a portion of the flex circuit.

* * * * *